US009606156B1

(12) United States Patent
Smith

(10) Patent No.: US 9,606,156 B1
(45) Date of Patent: Mar. 28, 2017

(54) METHOD FOR EVALUATING SIGNAL ATTENUATION BY COMPARING A MEASURED ATTENUATION AGAINST AN IDEAL ATTENUATION

(71) Applicant: Barry Andrew Smith, Media, PA (US)

(72) Inventor: Barry Andrew Smith, Media, PA (US)

( * ) Notice: Subject to any disclaimer, the term of this patent is extended or adjusted under 35 U.S.C. 154(b) by 0 days.

(21) Appl. No.: 14/947,646

(22) Filed: Nov. 20, 2015

Related U.S. Application Data

(60) Provisional application No. 62/090,086, filed on Dec. 10, 2014.

(51) Int. Cl.
*G01R 27/28* (2006.01)
*G01R 31/28* (2006.01)
*G01R 19/00* (2006.01)

(52) U.S. Cl.
CPC ......... *G01R 27/28* (2013.01); *G01R 31/2822* (2013.01); *G01R 19/0007* (2013.01)

(58) Field of Classification Search
CPC .... G01R 19/0007; G01R 27/00; G01R 27/28; G01R 31/28; G01R 31/282; G01R 31/2822; G01R 33/3607
USPC ............ 324/600, 612, 615, 616, 76.11, 126; 702/189, 190, 191, 194; 73/599
See application file for complete search history.

(56) References Cited

U.S. PATENT DOCUMENTS

| | | | |
|---|---|---|---|
| 2,624,780 A | 1/1953 | Byrne | |
| 3,763,306 A | 10/1973 | Marshall | |
| 4,766,386 A | 8/1988 | Oliver et al. | |
| 4,779,064 A | 10/1988 | Monser | |
| 5,864,259 A | 1/1999 | Persson | |
| 6,519,538 B1* | 2/2003 | Bowman | H02M 3/00 324/176 |
| 6,745,137 B2 | 6/2004 | Krishnamachari et al. | |
| 7,573,332 B1* | 8/2009 | Kase | H03F 3/45183 330/253 |
| 8,965,012 B1* | 2/2015 | Dong | H04R 1/028 381/151 |
| 2003/0006783 A1* | 1/2003 | Min | G01R 27/2605 324/676 |
| 2004/0167420 A1* | 8/2004 | Song | A61B 5/053 600/547 |
| 2005/0099187 A1* | 5/2005 | Ryder | G01R 31/2846 324/547 |

(Continued)

*Primary Examiner* — Hoai-An D Nguyen
(74) *Attorney, Agent, or Firm* — Jerry Haynes Law

(57) ABSTRACT

A method for evaluating signal attenuation of an impedance member includes setting at least one ideal attenuation of an ideal impedance member, setting at least one attenuation range for the at least one ideal attenuation, measuring at least one first test attenuation at a first test signal frequency of the subject impedance member, measuring at least one second test attenuation at a second test signal frequency of the subject impedance member, comparing the at least one first test attenuation and the at least one second test attenuation with the at least one attenuation range for the at least one ideal attenuation, determining whether the at least one first test attenuation and the at least one second test attenuation fall within the at least one attenuation range and performing a troubleshooting function on the subject impedance member if the at least one first test attenuation or the at least one second test attenuation fall outside the at least one attenuation range.

20 Claims, 7 Drawing Sheets

(56) References Cited

U.S. PATENT DOCUMENTS

| | | | |
|---|---|---|---|
| 2007/0197886 A1* | 8/2007 | Naganuma | A61B 5/0095 600/322 |
| 2014/0266268 A1* | 9/2014 | Lipowitz | G01R 27/02 324/709 |

* cited by examiner

| SERIES-6 ATTENUATION | | |
|---|---|---|
| Electrical Length (Ft) @ 68F | Attn (dB)@55 MHz | Attn @ 750 MHz |
| 40 | 0.6 | 2.2 |
| 47 | 0.7 | 2.6 |
| 53 | 0.8 | 3.0 |
| 60 | 0.9 | 3.4 |
| 67 | 1.9 | 3.7 |
| 73 | 1.1 | 4.1 |
| 80 | 1.2 | 4.5 |
| 87 | 1.3 | 4.9 |
| 93 | 1.4 | 5.2 |
| 100 | 1.5 | 5.6 |
| 107 | 1.6 | 6.0 |
| 113 | 1.7 | 6.3 |
| 120 | 1.8 | 6.7 |
| 127 | 1.9 | 7.1 |
| 133 | 2.0 | 7.5 |
| 140 | 2.1 | 7.8 |
| 147 | 2.2 | 8.2 |
| 153 | 2.3 | 8.6 |
| 160 | 2.4 | 9.0 |
| 167 | 2.5 | 9.3 |
| 173 | 2.6 | 9.7 |
| 180 | 2.7 | 10.1 |

FIG. 3

Attenuation Calculations for SERIES-6 Coaxial Cables — 118
126 124 @55 MHz @ 750 MHz 128 130

| | @55 MHz | @ 750 MHz |
|---|---|---|
| Cable In (dBmV) | 10 | 19 |
| Cable Out (dBmV) | 8.5 | 13 |
| Measured Loss (dB) | 120 ▶ 1.5 | 6 ◀ 122 |
| RESULT | PASS | |
| Electrical Length (ft) @ 68F | 100 ◀ 102 | |

FIG. 5A

Attenuation Calculations for SERIES-6 Coaxial Cables — 118
126 124 @55 MHz @ 750 MHz 128 130

| | @55 MHz | @ 750 MHz |
|---|---|---|
| Cable In (dBmV) | 10 | 19 |
| Cable Out (dBmV) | 8.5 | 11 |
| Measured Loss (dB) | 120 ▶ 1.5 | 8 ◀ 122 |
| RESULT | Excess High Frequency Loss-Check for moisture damage | |
| Electrical Length (ft) @ 68F | 100 ◀ 102 | |

FIG. 5B

Attenuation Calculations for SERIES-6 Coaxial Cables — 118
126 124 @55 MHz @ 750 MHz 128 130

| | @55 MHz | @ 750 MHz |
|---|---|---|
| Cable In (dBmV) | 10 | 19 |
| Cable Out (dBmV) | 7 | 11 |
| Measured Loss (dB) | 120 ▶ 3 | 8 ◀ 122 |
| RESULT | Excess Low Frequency Loss-Check connectors | |
| Electrical Length (ft) @ 68F | 143 ◀ 102 | |

FIG. 5C

Attenuation Variables for SERIES-6 Coaxial Cables

| | | |
|---|---|---|
| 104 — F1 – Low Frequency (MHz) | 55 | User Defined |
| 106 — F2 – High Frequency (MHz) | 750 | User Defined |
| 140 — LF1 – Loss @ F1 (dB) per 100 ft | 1.5 | Cable Specification |
| 142 — LF2 – Loss @ F2 (dB) per 100 ft | 5.6 | Cable Specification |
| 144 — Tolerance @ LF (dB) | 0.4 | User Defined |
| Loss Ratio – F2 to F1 | 3.733 | Formula |

FIG. 5D

METHOD FOR EVALUATING SIGNAL ATTENUATION BY COMPARING A MEASURED ATTENUATION AGAINST AN IDEAL ATTENUATION

CROSS-REFERENCE TO RELATED APPLICATIONS

This application claims the benefit of U.S. provisional application No. 62/090,086, filed Dec. 10, 2014 and entitled METHOD FOR DETERMINING SIGNAL ATTENUATION BY COMPARING A MEASURED ATTENUATION AGAINST AN IDEAL ATTENUATION, which provisional application is hereby incorporated by reference herein in its entirety.

FIELD OF THE INVENTION

The present invention relates generally to a method for evaluating signal attenuation of an impedance member by comparing the measured attenuations of test signals with ideal attenuations. More so, the present invention relates to a method for evaluating a signal attenuation of an impedance member such as a coaxial cable by comparing measured attenuations at specific frequencies against an attenuation range of ideal attenuations, and troubleshooting the impedance member based on where the measured attenuations fall within a predetermined range.

BRIEF DESCRIPTION OF THE DRAWINGS

The invention will now be described, by way of example, with reference to the accompanying drawings, in which:

FIG. 3 is a table of an exemplary attenuation chart illustrating a narrow attenuation range and a wide attenuation range of ideal attenuations for comparison with measured first and second test attenuations from a measured impedance member, according to an illustrative embodiment of the method for evaluating signal attenuation;

FIGS. 5A, 5B and 5C are tables of an exemplary spreadsheet comparison of attenuations between ideal and measured impedance members to determine whether the first test attenuation or the second test attenuation falls outside the range, according to an illustrative embodiment of the method for evaluating signal attenuation;

FIG. 5D is a table which includes the user-defined variables based on cable size, test frequencies and the acceptable tolerance;

Like reference numerals refer to like parts throughout the various views of the drawings.

DETAILED DESCRIPTION OF THE INVENTION

Figure 1:
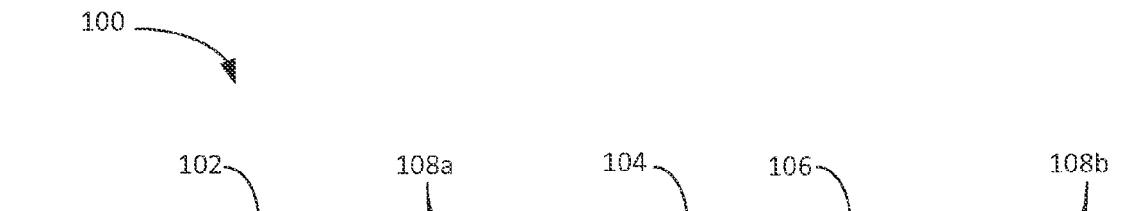
FIG. 1 is a table of an exemplary attenuation chart illustrating a plurality of rows having impedance dimensions and at least one ideal attenuation at a first frequency and a second frequency, according to an illustrative embodiment of the method for evaluating signal attenuation.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIGS. 1-7. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

Telecommunications networks carry hundreds of RF signals over a single conductor. The broadband service typically extends from a low frequency of Channel 2 or 55 MHZ to an upper frequency of 600, 750, 860 or 1000 MHz, depending on the network design. This broadband signal loses energy over distance, the higher the frequency of the signal the greater the energy loss, or attenuation, of the RF signal. Cable attenuation, or signal loss, is typically specified in dB/100 feet for strategic frequencies from 55 MHz to over 1000 MHz.

TABLE I

Example of Attenuation Specification for Series-6 Flexible Coaxial Cable

| Attenuation per 100 feet | Attn @ 55 MHz | Attn @ 300 MHz | Attn @ 750 MHz | Attn @ 860 MHz |
|---|---|---|---|---|
| Series 6 Cable | 1.5 dB | 3.6 dB | 5.6 dB | 6.1 dB |

(a). From Table I above, if the length of a cable is known, then the signal loss can easily be calculated for any frequency;

(b). If the signal loss is known at a particular frequency, the length of the cable can be calculated;

(c). Because the ratio of the signal loss between any two frequencies is a constant, if the signal loss at a particular frequency is known; the signal loss at any other frequency can be calculated;

(d). The specifications of Table I can be used to create a "plurality" of signal losses depending on the cable length for the low frequency and high frequency.

Illustrative embodiments of the disclosure are described in FIGS. 1-7 and are generally directed to a method 200 (FIG. 6) for determining the attenuation of a measured impedance member 110 (FIG. 7) by obtaining and comparing at least one measured test attenuation 120, 122 against at least one ideal attenuation 108a, 108b in an ideal attenuation range 112 (FIG. 3), hereinafter ideal attenuation range 112, to determine transmission quality and necessity of troubleshooting for the measured impedance member 110. The inclusion of the narrow attenuation range 112 within the wide attenuation range 114 illustrates that the acceptable attenuation performance window could be varied to accommodate a system's specific pass or fail requirements when identifying a "good" impedance member 110 from a "substandard" impedance member 110. Some systems may require a tighter tolerance while other systems may prefer a broader acceptable tolerance window. The method 200 may compare a first test attenuation 120 and a second test attenuation 122 against a first ideal attenuation 108a and a second ideal attenuation 108b, respectively, obtained from an ideal attenuation member (not shown). Based on whether the first test attenuation 120 and the second test attenuation 122 falls within a narrow attenuation range 112 of the first ideal attenuations 108a and the second ideal attenuations 108b, a troubleshooting function may be performed on the measured impedance member 110.

In essence, the method 200 may determine whether the at least one first test attenuation 120 and the at least one second test attenuation 122 fall within a narrow attenuation range 112 of ideal attenuations 108a, 108b. If both of the first test attenuation 120 and the second test attenuation 122 fall within the at least one range 112, then an attenuation tolerance of the impedance member 110 may be deemed acceptable. If, on the other hand, either the first test attenuation 120 or the second test attenuation 122 falls outside the at least one range 112, then a troubleshooting function may be performed on the measured impedance member 110.

In some embodiments, the tested attenuation member 110 may include, for example and without limitation, a coaxial cable used for transmission of radio frequency signals for video and CATV distribution, RF and microwave transmission, and computer and instrumentation data connections. The method 200 may allow for quick and accurate determination of the transmission quality of any length of a coaxial cable with minimal utilization of mathematics and no need to compensate for temperature variances.

Those skilled in the art will recognize that understanding RF attenuation and the ability to calculate signal loss at various frequencies are fundamental skills required for every Broadband Service installer and technician. In the classroom, technicians learn to accurately calculate signal losses at multiple frequencies (typically at the lowest and highest frequencies) for various lengths of cable. The traditional cable troubleshooting approach tries, however, to qualify a cable based on an estimate of the cable length.

Additionally, multiple complicated mathematical functions are required for traditional methods. Thus, these traditional methods of estimating drop length and rounding errors often translate into overlooking damaged or inferior performing cables. The present method 200 attempts to rectify these inefficiencies by providing a quick, visual comparison between at least one ideal attenuation 108a, 108b, and a first test attenuation 120 and a second test attenuation 122 of a measured impedance member 110.

As referenced in FIGS. 1-5C, the method 200 (FIG. 6) may utilize an ideal attenuation chart 100 (FIG. 1) that forms a reference point for the at least one ideal attenuation 108a, 108b for an ideal impedance member 110, corresponding to a broadband test signal having a first attenuation test signal frequency 104 and a second attenuation test signal frequency 106. The ideal attenuation chart 100 may be created by using a first ideal attenuation specification 140 and a second ideal attenuation specification 142 (FIG. 5D) to create a plurality of ideal attenuations for various lengths of cable. In some embodiments, the ideal impedance member 110 may be a Series-6 cable measured at 68 degrees Fahrenheit, having at least one ideal attenuation 108a, given in 0.1 decibel (dB) increments at 55 MHz with the corresponding at least one ideal attenuation 108b at 750 MHz.

As further illustrated in FIG. 1, in some embodiments, the ideal attenuation chart 100 may include a plurality of rows, with each row having an impedance dimension 102 corresponding to an impedance member 110 having a predetermined length. In some embodiments, the impedance dimension 102 may include a coaxial cable having a length of between about sixty and one hundred-sixty feet. Each row of impedance dimensions 102 may also include a first ideal attenuation 108a and a second ideal attenuation 108b that correlates with the ideal impedance member 110. In some embodiments, the first test signal frequency 104 may be 55 Megahertz (MHz) and the second test signal frequency 106 may be 750 MHz, though in other embodiments, higher or lower frequencies may be used. Those skilled in the art will recognize that a higher frequency and a larger impedance dimension 102 (length of cable) results in a correspondingly higher ideal attenuation 108a and 108b. In some embodiments, the at least one ideal attenuation 108a, 108b is derived from a standard cable attenuation vs. frequency specification known in the art. In other embodiments, standard formulas known in the art may be used to derive the at least one ideal attenuation 108a, 108b. In yet other embodiments, the ideal attenuation may be derived from actual attenuation measurements of a known length of cable.

Figure 2:
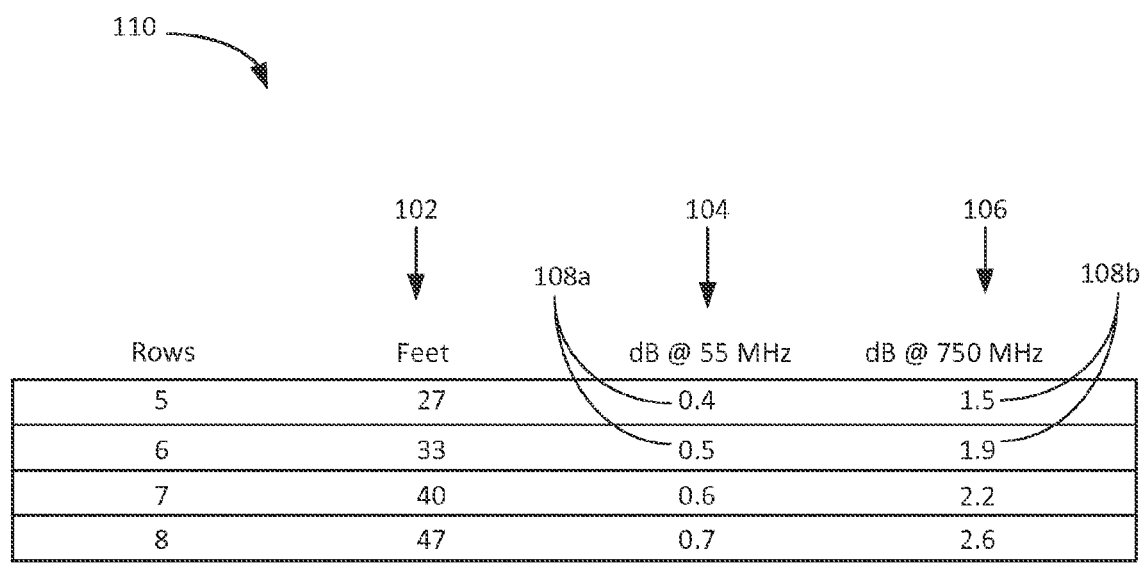
FIG. 2 is a table of an exemplary at least one range providing an acceptable tolerance window for attenuations, according to an illustrative embodiment of the method for evaluating signal attenuation.

The table in FIG. 2 represents a way to represent the tolerance found in the acceptable narrow attenuation range 112, illustrated as a box or window in the ideal attenuation chart 100 in FIG. 3.

FIG. 3 illustrates the at least one attenuation range 112 in the ideal attenuation chart 100. The acceptable narrow attenuation range 112 may be used as the chief points of comparison with the first test attenuation 120 and the second test attenuation 122 from the measured impedance member 110. This comparison may determine whether troubleshooting of the measured impedance member 110 is required. In some embodiments, a plurality of rows in the ideal attenuation chart 100 that contain the ideal attenuations 108a, 108b may be boxed in to include or contain the acceptable narrow attenuation range 112. In this manner, quick visual comparisons and verifications can be performed in the field such that the measured first test attenuation 120 and second test attenuation 122 are compared against the ideal attenuations 108a, 108b.

In the FIG. 3 example, a second, a wider attenuation range 114 may be added to the narrow attenuation range 112. In this example, the narrow attenuation range 112 for the first test signal frequency 104 of 55 MHz falls between 1.5-1.9 dB, whereas the wide attenuation range 114 for the first test signal frequency 104 falls between 1.5-2.0 dB. The narrow attenuation range 112 for the second test signal frequency 106 of 750 MHz falls between 5.6-7.1 dB, while the wide attenuation range 114 for the second test signal frequency 106 falls between 5.6-7.5 dB.

According to the table in FIG. 3, if the measured loss at 55 MHz is 1.5 dB, the acceptable loss at 750 MHz is from 5.6 dB to 7.1 dB for the narrow attenuation range 112, or from 5.6 to 7.5 dB for the wide attenuation range 114. Similarly, if the measured loss at 750 MHz is 5.6 dB, the loss at 55 MHz should not exceed 1.9 dB for the narrow attenuation range 112 or 2.0 dB for the wide attenuation range 114. The field attenuation measurements that fall outside the narrow attenuation range 112 and the wide attenuation range 114 have a response that falls outside of an acceptable window and require troubleshooting for excessive attenuation.

Referring again to FIGS. 1-3, the first ideal attenuation 108a and the second ideal attenuation 108b are straight across any single row. Because cables deployed in the field seldom have perfect "ideal attenuations", some "tolerance" or margin of error must be used to allow for cable aging and variations in manufacturing practices. This tolerance is identified as the user-defined range 144 and can be visually represented as the acceptable performance window of the narrow attenuation range 112. In spreadsheet, smartphone, or automated meter functions, the end user will be able to vary the size of the acceptable attenuation performance window of the attenuation range 112 as determined by the value entered into the user-defined range 144.

The acceptable tolerance corresponding to the user-defined range 144 and the size of the acceptable attenuation performance window of the narrow attenuation range 112 may be identified at measurement intervals of the low frequency signal levels (first ideal attenuation 108a). However, the measurement intervals may alternatively be based on the high frequency signal levels (second ideal attenuation 108b) or on the representative distance intervals (impedance dimension 102). FIG. 2 illustrates the various ways in which the acceptable performance window can be identified.

While it may not be necessary in some applications, a second acceptable performance window, corresponding to a wide attenuation range 114, may provide an end user with two alert levels. For example, if both of first test attenuation 120 and the second test attenuation 122 fall within the smaller acceptable performance window of the narrow attenuation range 112, the impedance member 110 may be considered "good". If both the first test attenuation 120 and the second test attenuation 122 fall outside of the smaller acceptable performance window of the narrow attenuation range 112 but inside the larger acceptable performance window of the wide attenuation range 114, the impedance member 110 may be considered "marginal". If both the first test attenuation 120 and the second test attenuation 122 fall outside the wide attenuation range 114, the impedance member 110 may be considered "unacceptable" and require repair or replacement.

If only a single frequency attenuation measurement is used to validate the quality of the impedance member 110, signal impairments or other service affecting issues can easily be overlooked. By using the measured low frequency first test attenuation 120 to determine what the ideal high frequency or second ideal attenuation 108b should be AND by using the measured high frequency second test attenuation 122 to determine what the ideal low frequency first ideal attenuation 108a should be. This method of simultaneously comparing the measured attenuations with the ideal attenuations, or using each measurement to double-check the other measurement, will immediately validate the attenuation quality of the conductor or immediately identify excess attenuation that requires further troubleshooting.

Those skilled in the art, in light of the present teachings, will recognize that an acceptable tolerance, represented by the narrow attenuation range 112, must be sufficiently tight to identify inferior cable performance while at the same time not indicate the need for unnecessary connector or cable replacement. In some embodiments, the acceptable tolerance can be adjusted by changing the size of at least one user-defined range 144 (FIG. 5D). Setting the acceptable tolerance must take bandwidth between the two carriers into account; the wider the bandwidth between the two carriers, the greater the potential difference for the same degree of tilt. For example, the 750 MHz frequency may have a range tolerance of 0.5 dB at 55 MHz, while an 860 MHz frequency may have an acceptable range tolerance of 0.6 dB at 55 MHz.

Figure 4:
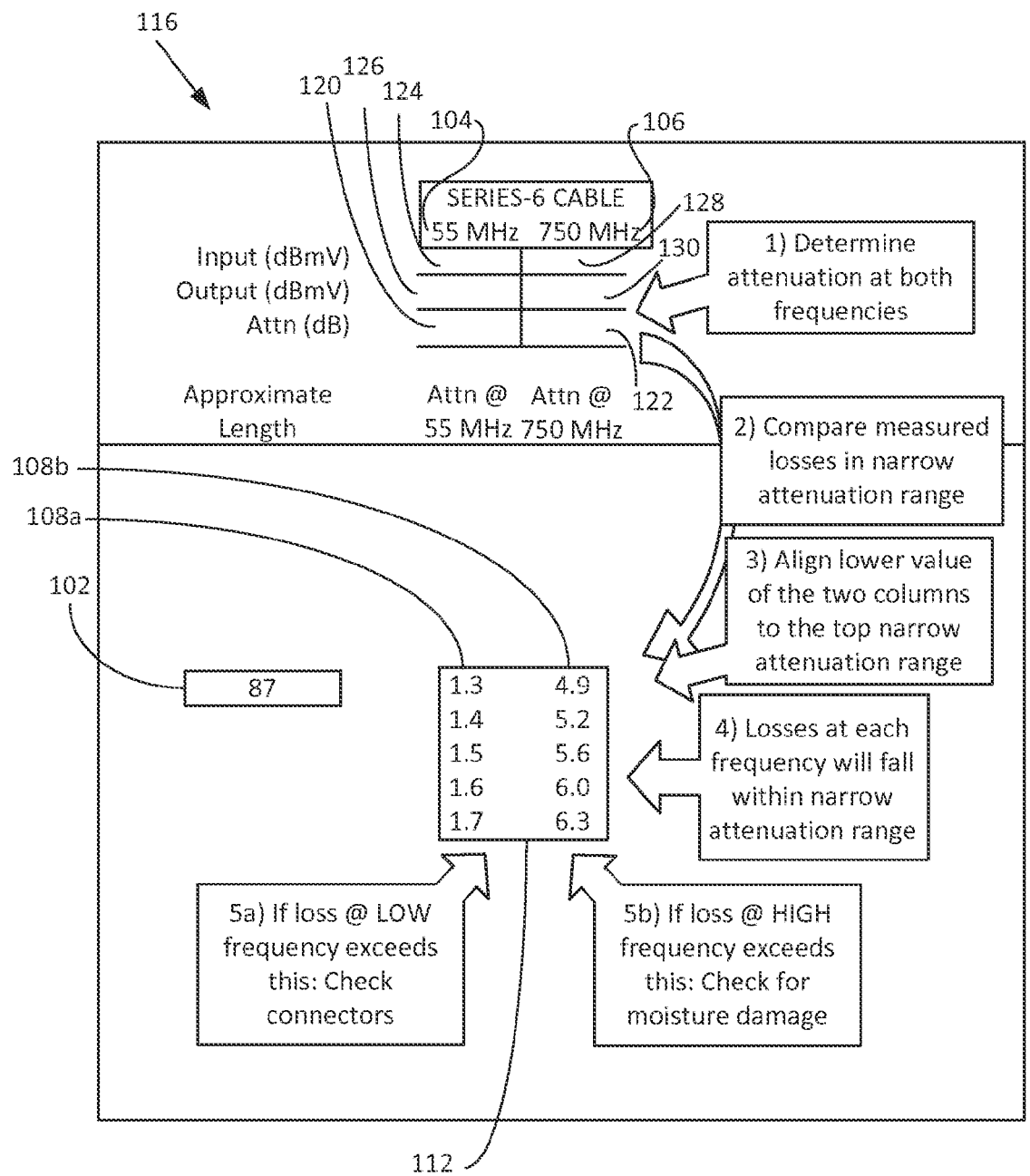
FIG. 4 is a table of an exemplary slide-type attenuation device to provide a comparison of attenuations between ideal and measured impedance members to determine whether the first test attenuation or the second test attenuation falls outside the range, according to an illustrative embodiment of the method for evaluating signal attenuation.
Figure 7:
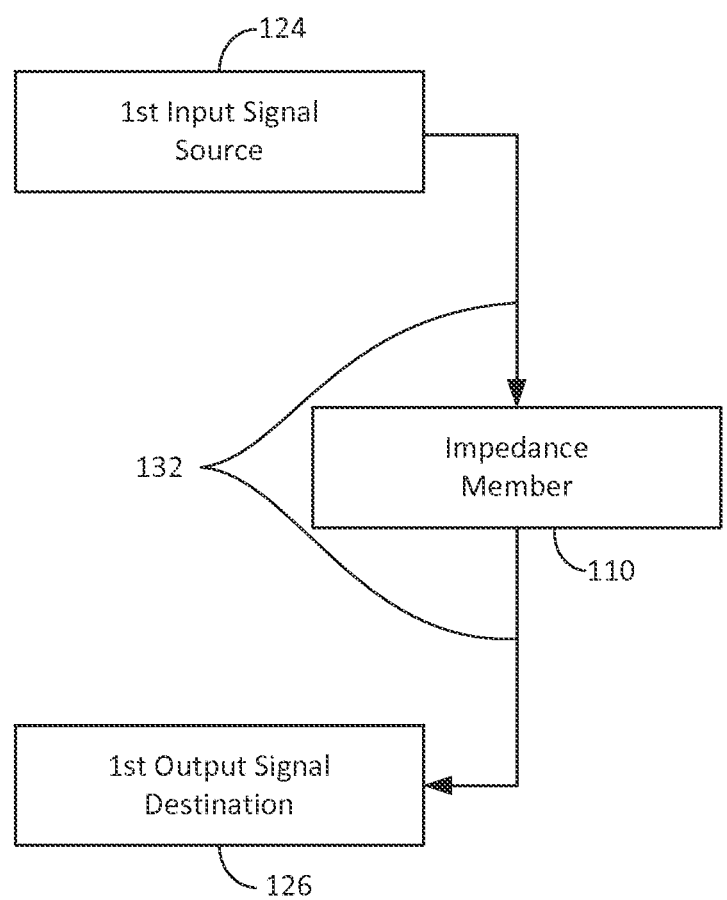
FIG. 7 is a block diagram illustrating transmission of a first test signal frequency from a input signal source through an impedance member to a first output signal destination and transmission of a second test signal frequency from the same input signal source through the impedance member to the output signal destination in typical implementation of an illustrative embodiment of the method.

As illustrated in FIGS. 4 and 7, in some embodiments, the tested impedance member 110 may include a coaxial cable that extends from at least one input signal source 124/128 such as a tap, for example and without limitation, to at least one output signal destination 126/130 such as a bond block, for example and without limitation. The tested and measured impedance member 110 may produce at least one first test attenuation 120 measured at the first test signal frequency 104 and at least one second test attenuation 122 measured at the second test frequency 106. The first test attenuation 120 may be derived by subtracting a low frequency output signal level 126 from the low frequency input signal level 124. The second test attenuation 122 may be derived by subtracting a high frequency output signal level 130 from the high frequency input signal level 128. The derived first test attenuation 120 and second test attenuation 122 may then be compared to the narrow attenuation range 112 in the ideal attenuation chart 100 to derive an acceptable tolerance of attenuation for the measured impedance member 110.

In some embodiments, the method 200 may measure the attenuations of the impedance member 110 at the first test signal frequency 104 and the second test signal frequency 106 to derive the corresponding first test attenuation 120 and second test attenuation 122. The first test attenuation 120 and second test attenuation 122 may be compared to the ideal attenuations 108a, 108b in the attenuation range 112. If the first test attenuation 120 and the second test attenuation 122 fall within the narrow attenuation range 112, then the tolerance may be deemed acceptable. If, on the other hand, the first test attenuation 120 and/or the second test attenuation 122 falls outside the narrow attenuation range 112, performance of a troubleshooting function on the tested impedance member 110 may be deemed necessary. For example and without limitation, if the first test attenuation 120 is greater than the first ideal attenuation 108a at the narrow attenuation range 112 for the first test signal frequency 104, then the connectors of the impedance member 110 may require troubleshooting. If the second test attenuation 122 is, however, greater than the second ideal attenuation 108b at the narrow attenuation range 112 for the second test signal frequency 106, troubleshooting might require checking for moisture in the measured impedance member 110 or connector.

The comparison of the first attenuation 120 and the second attenuation 122 with the first ideal attenuation 108a and the second ideal attenuation 108b can be performed through various techniques. One technique may involve manual comparison through a slide-type attenuation comparison 116 (FIG. 4). This might include Series-6 on one side and Series-59, or 11 on the opposite side. A second technique may be performed mathematically in a spreadsheet and/or a smartphone app through an attenuation comparison 118 (FIGS. 5A-5C). In this technique enter the low frequency signal level measured at the cable input 124, enter the low frequency signal level measured at the cable output 126, enter the high frequency signal level measured at the cable input 128, enter the high frequency signal level measured at the cable output 130, the application will automatically subtract the output signal levels 126 & 130 from the input signal levels 124 & 128 respectively to determine the attenuation of the impedance member 120 & 122 at frequencies 104 & 106 respectively; or by directly entering the measured first test attenuation 120 and second test attenuation 122.

In some embodiments, yet another technique for comparing the first test attenuation 120 and the second test attenuation 122 with the first ideal attenuation 108a and the second ideal attenuation 108b can be integrated into a signal level meter or other RF test equipment (not shown). The signal level meter typically stores the measurements at the signal source 124/128 and signal output 126/130. The signal level meter may compare the measurements, potentially identifying a go/no-go indication or providing a visual representation of the cable's attenuation response. The signal level meter may provide a true response trace because it can compare input and output signal levels at multiple frequencies. Additional comparison methods may, however, also be used in other embodiments.

FIG. 4 illustrates an exemplary slide-type attenuation comparison 116 between ideal and measured impedance members 110. FIG. 4 represents the same table as in FIG. 1 using the same window of acceptable attenuation range 112, as shown in FIG. 3, but incorporated into a slide table that could be used in the field. This slide-type attenuation comparison 116 enables the determination of whether the first or second test attenuation 120, 122 fall outside the attenuation range 112. The first and second test attenuation 120, 122 may be aligned with the attenuation range 112 to determine if any functions are necessary. In this specific example, the slide rule comparison shows acceptable attenuation, or tolerance, can be anything from 1.3 dB @ 55 MHz and 6.3 dB @ 750 MHz, to 1.7 dB @ 55 MHz and 4.9 dB @ 750 MHz. The effective electrical length of impedance dimension 102 of the cable in this example is 87 feet.

FIGS. 5A, 5B, and 5C illustrate at least one input signal source 124/128, which may include a Cable In region. The input signal source is where the high frequency and low frequency input signal levels would be measured at the output of the tap 124/128, which is the input to the cable. The output signal destination may include a Cable Out region. The output signal destination 126/130 is where the high frequency and low frequency output signal levels would be measured at the bond block or side of the premises. These test attenuations 120, 122 may then be compared with the table of ideal attenuations in the ideal attenuation chart 100 to determine whether the test attenuations 120, 122 fall within a user-identified tolerance.

FIGS. 5A, 5B, and 5C illustrate various tables of exemplary spreadsheet attenuation comparison 118 between ideal and measured impedance members 110. The spreadsheet attenuation comparison 118 enables the determination of whether the first test attenuation 120 or the second test attenuation 122 falls outside the attenuation range 112. In FIG. 5A, the measured first test attenuation 120 and second test attenuation 122 may fall within the attenuation range 112, in which case the measured impedance member 110 does not require maintenance. The first test signal frequency 104 has a first test attenuation 120 of 1.5 dB, and the second test signal frequency 106 has a second test attenuation 122 of 6 dB.

In FIG. 5B, the first test signal frequency 104 has a first test attenuation 120 of 1.5 dB, and the second test signal frequency 106 has a second test attenuation 122 of 8 dB. Thus, the measured second test attenuation 122 falls outside the attenuation range 112, with an excessively high attenuation at the second (higher) frequency 106. Therefore, the measured impedance may require troubleshooting of the impedance member 110 for possible moisture damage.

In FIG. 5C, the measured attenuation falls outside the attenuation range 112, with an excessively high attenuation at the first (lower) frequency 104. The first test signal frequency 104 has a first test attenuation 120 of 3 dB, and the second test signal frequency 106 has a second test attenuation 122 of 8 dB. Thus, the measured impedance may require troubleshooting of the connectors.

FIG. 5D illustrates the attenuation variables of the ideal impedance member 110, which are used for comparison. The first ideal attenuation specification 140 at the first test signal frequency 104 is 1.5 dB/100 feet, and the second ideal attenuation specification 142 at the second test signal frequency 106 is 5.6 dB/100'. The user-defined range 144 is also shown in FIG. 5D.

FIG. 5A shows a measured first test attenuation 120 of 1.5 dB at the low test signal frequency 104 and a measured second test attenuation 122 of 6.0 dB at the high test signal frequency 106. Since both attenuation values fall within the acceptable attenuation performance window 112, the impedance member 110 is "good".

FIG. 5B shows a measured first test attenuation 120 of 1.5 dB at the low test signal frequency 104, and a measured second test attenuation 122 of 8.0 dB at the high test signal frequency 106. The acceptable performance window 112 indicates that for low frequency first test attenuation 120 of 1.5 dB, the acceptable attenuation range for the high frequency is from 5.6 dB to 7.1 dB. Since measured high frequency second test attenuation 122 of 8.0 dB is greater than the maximum acceptable attenuation, this impedance member 110 is identified as having excess high frequency attenuation and must be repaired or replaced.

FIG. 5C shows a measured first test attenuation 120 of 3.0 dB at low test signal frequency 104 and a measured high frequency test attenuation 122 of 8.0 dB at the high test signal frequency 106. While not clearly shown in FIG. 5C, attempting to place the acceptable performance window 112 so that both values 120 and 122 fall within the window cannot be done. For a high frequency attenuation of 8.0 dB, the maximum attenuation for the low frequency measurement would be approximately 2.6 dB. This impedance member 110 is identified as having excess low frequency attenuation and must be repaired or replaced.

Figure 6:
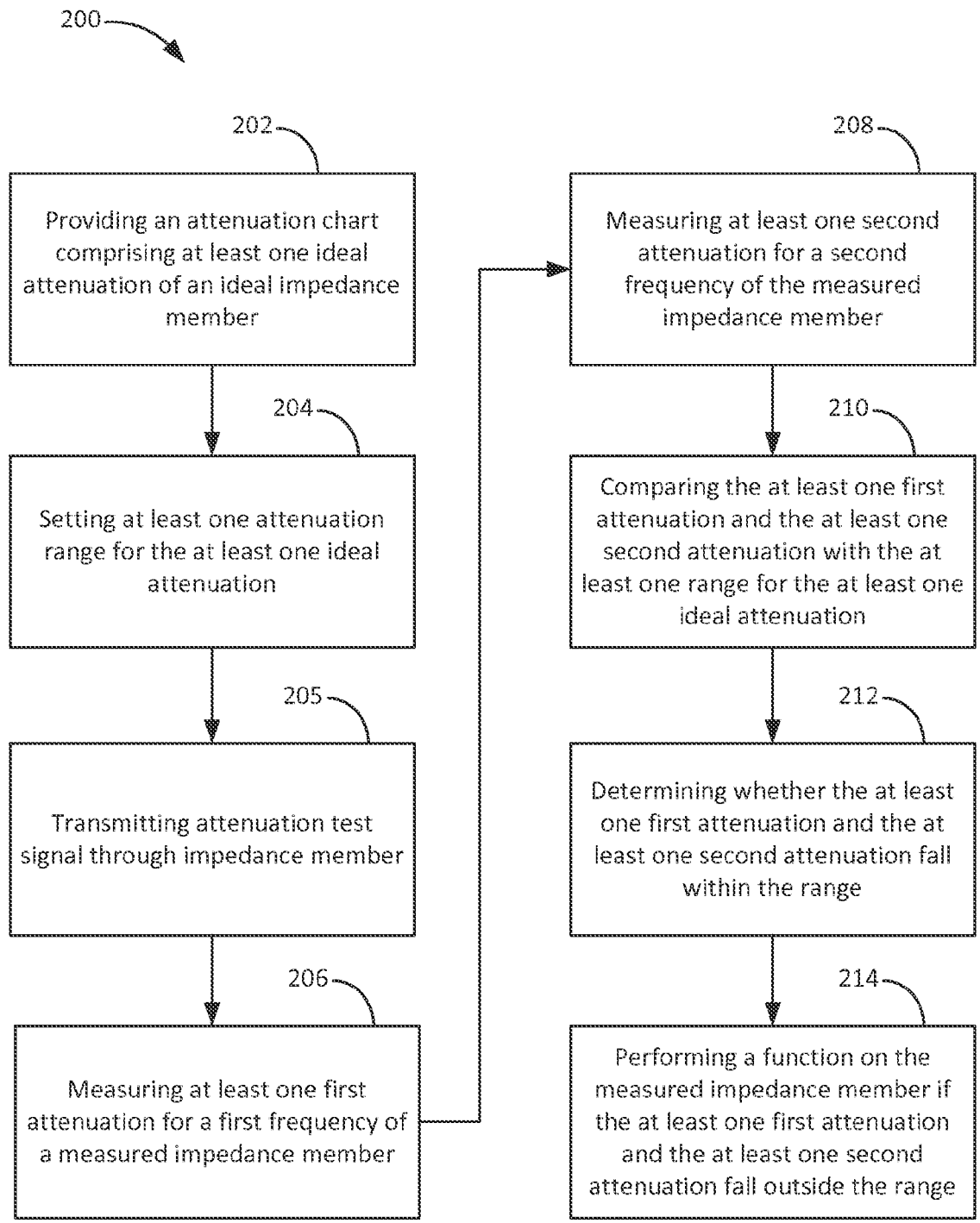
FIG. 6 is a flowchart diagram of an exemplary method for evaluating signal attenuation for a measured impedance member, according to an illustrative embodiment of the method.

FIG. 6 illustrates a flowchart 200 of an exemplary method for evaluating the attenuation of a measured impedance member 110 by comparing a first test attenuation 120 and a second test attenuation 122 against the attenuation range 112 of at least one ideal attenuation 108a, 108b to determine transmission quality and necessity of troubleshooting for the measured impedance member 110. The method 200 may include an initial Step 202 of providing an ideal attenuation chart 100 (FIG. 1) comprising at least one ideal attenuation 108a, 108b for an ideal impedance member 110. The at least one ideal attenuation 108a, 108b may be based on an impedance dimension 102 (FIGS. 2 and 3) such a length of cable, for example and without limitation. The ideal attenuation chart 100 forms a reference point of at least one ideal attenuation 108a, 108b, and is chiefly used as a comparison with the first test attenuation 120 and the second test attenuation 122.

The method 200 may further include a Step 204 of setting at least one attenuation range 112 for the at least one ideal attenuation 108a, 108b. The attenuation range 112 represents the highest population of ideal attenuations 108a, 108b for the impedance member 110 as measured. The attenuation range 112 can include ideal attenuations 108a, 108b at a first test signal frequency 104 and a second test signal frequency 106, respectively.

The method 200 may include a Step 205 of transmitting at least one attenuation test signal through the impedance member 110. As illustrated in FIG. 7, in some embodiments, transmitting at least one test signal 132 through the impedance member 110 may include transmitting a test signal frequency 104 and a second test signal frequency 106 through the impedance member 110. The first attenuation 120 may have a signal frequency 104 of about 55 MHz, whereas the second attenuation 122 may have a signal frequency 106 of about 750 MHz.

A Step 210 may include comparing the at least one first test attenuation 120 and the at least one second test attenuation 122 with the at least one attenuation range 112 of the at least one ideal attenuation 108a, 108b. The comparisons of the at least one first test attenuation 120 and the at least one second test attenuation 122 with the ideal attenuations 108a, 108b can be performed through various techniques. One technique may include manual comparison through a slide-type attenuation comparison 116 (FIG. 4). A second technique may be performed mathematically in a spreadsheet and/or a smartphone app through a spreadsheet attenuation comparison 118 (FIGS. 5A-5C). A third technique can be performed with a signal level meter or other RF test equipment (not illustrated). The signal level meter typically stores the measurements at the input to and the output from the impedance member 110, such as the tap and the bond block in some embodiments, and could use these measurements to identify a go/no-go condition or to create a visual representation of the cable's attenuation response trace.

In some embodiments, a Step 212 may include determining whether the at least one first test attenuation 120 and the at least one second test attenuation 122 fall within the at least one attenuation range 112. The first and second test attenuations 120, 122 are compared to the ideal attenuations 108a, 108b in the attenuation range 112. If the first and second test attenuation 120, 122 fall within the at least one attenuation range 112, the tolerance may be deemed acceptable. If the first and/or second attenuation 120, 122 fall outside the attenuation range 112, a function may be performed on the measured impedance member 110.

A final Step 214 may include performing a function on the measured impedance member 110 if the at least one first test attenuation 120 and/or the at least one second test attenuation 122 fall outside the attenuation range 112. In one possible troubleshooting function, if the second test attenuation 122 falls outside the attenuation range 112, with an excessively high attenuation at the second (higher) frequency 106, the measured impedance may require troubleshooting of the impedance member 110 for possible moisture damage. If, however, the first test attenuation 120 falls outside the attenuation range 112, with an excessively high attenuation at the first (lower) frequency 104, the measured impedance may require troubleshooting of the connectors.

It will be appreciated by those skilled in the art that in some embodiments, the methods of the disclosure can be implemented as a built-in software or other application which is loaded into a desktop computer, laptop computer, tablet or device. Accordingly, the methods may include any software or other application which determines the attenuation of a length of cable by:

(1). measuring and recording the low frequency (104) input signal level (126) and the high frequency (106) input signal level (128);

(2). measuring and recording the low frequency (104) output signal level (126) and the high frequency (106) output signal level (130);

(3). subtracting the low frequency (104) output signal level (126) from the low frequency (104) input signal level (124) to determine the measured low frequency (104) attenuation (120); and (4). subtracting the high frequency (106) output signal level (130) from the high frequency (106) input signal level (128) to determine the measured high frequency (104) attenuation (122).

In a smartphone or other automated application, the end user may be provided with the option of entering the measured low-frequency and high-frequency input signal levels (124, 128) and entering the measured low frequency and high frequency output signal levels (123, 130), allowing the low frequency and high frequency attenuations (120, 122) to be automatically calculated. Alternatively, the end user may enter the low frequency and high frequency attenuations (120, 122) values directly.

Test equipment used for measuring RF signal levels may be capable of capturing and recording the cable input and output signal levels at two or more strategic frequencies. In some applications, the test equipment may capture the entire spectrum of the input and output signal levels, potentially providing a more detailed comparison and analysis of the conductor's attenuation. This may include a visual representation of the conductor's attenuation overall or as part of the network bandwidth.

To evaluate the measured attenuation of the length of cable in question, the measured low frequency attenuation (120) and the measured high frequency attenuation (122) may be compared simultaneously with the ideal attenuations (108a, 108b).

It will be further appreciated by those skilled in the art that the methods of the disclosure can be utilized for virtually any size flexible or ridged cables (Series-59, Series-6, 0.320QR, 0.500, 0.625, etc.). The methods can also be used for other impedance cables (50 ohm, 75 ohm, 93 ohm, etc.). The methods are applicable to virtually all frequencies of RF carriers, US broadband, International broadband and Satellite service providers. End users can customize the methods to identify custom cable size and custom strategic frequencies.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A method for evaluating a signal attenuation for a subject impedance member to be tested, the method comprising:
    setting at least one ideal attenuation of an ideal impedance member;
    setting at least one attenuation range for the at least one ideal attenuation;
    measuring at least one first test attenuation at a first test signal frequency of the subject impedance member;
    measuring at least one second test attenuation at a second test signal frequency of the subject impedance member;
    comparing the at least one first test attenuation and the at least one second test attenuation with the at least one attenuation range for the at least one ideal attenuation;
    determining whether the at least one first test attenuation and the at least one second test attenuation fall within the at least one attenuation range; and
    performing a troubleshooting function on the subject impedance member if the at least one first test attenuation or the at least one second test attenuation fall outside the at least one attenuation range.

2. The method of claim 1 wherein setting at least one ideal attenuation of an ideal impedance member comprises providing an attenuation chart comprising the at least one ideal attenuation of the ideal impedance member.

3. The method of claim 1 wherein the ideal impedance member and the measured impedance member comprise a coaxial cable.

4. The method of claim 1 wherein the at least one attenuation range comprises a tolerance for acceptable attenuation for the subject impedance member.

5. The method of claim 1 wherein the at least one acceptable attenuation range comprises a narrow attenuation range and a wide attenuation range.

6. The method of claim 5 wherein the narrow attenuation range ranges from about 1.5 dB to about 1.9 dB at 55 Megahertz and from about 5.6 dB to about 7.1 dB at 750 Megahertz.

7. The method of claim 1 wherein the first test signal frequency comprises 55 Megahertz.

8. The method of claim 1 wherein the second test signal frequency comprises 750 Megahertz.

9. The method of claim 1 wherein the first test signal frequency is about 55 Megahertz.

10. The method of claim 1 wherein the second test signal frequency is about 750 Megahertz.

11. A method for evaluating a signal attenuation for a subject impedance member to be tested, the method comprising:
    formulating an ideal attenuation chart by setting a plurality of ideal attenuations of an ideal impedance member at a plurality of impedance dimensions of the ideal impedance member;
    setting at least one acceptable performance range for the plurality of ideal attenuations;
    measuring at least one first test signal attenuation at a first test signal frequency of the subject impedance member;
    measuring at least one second test signal attenuation at a second test signal frequency of the subject impedance member;
    comparing the at least one first test attenuation and the at least one second test attenuation with the at least one attenuation range for the plurality of ideal attenuations;
    determining whether the at least one first test attenuation and the at least one second test attenuation fall within the at least one attenuation range; and
    performing a troubleshooting function on the subject impedance member if the at least one first test attenuation or the at least one second test attenuation fall outside the at least one attenuation range.

12. The method of claim 11 wherein the at least one attenuation range comprises a narrow attenuation range and a wide attenuation range.

13. The method of claim 12 wherein the narrow attenuation range ranges from about 1.5 dB to about 1.9 dB at 55 Megahertz for the first test signal frequency and from about 5.6 dB to about 7.1 dB at 750 Megahertz for the second test signal frequency from about 100 to about 127 feet respectively, for the impedance dimensions of the ideal impedance member at about 68 degrees F.

14. The method of claim 11 wherein the ideal impedance member and the measured impedance member comprise a coaxial cable.

15. The method of claim 11 wherein the at least one attenuation range comprises a tolerance for acceptable attenuation for the subject impedance member.

16. A method for evaluating a signal attenuation for a subject coaxial cable to be tested, the method comprising:
    formulating an ideal attenuation chart by setting a plurality of ideal attenuations of an ideal coaxial cable at a plurality of impedance dimensions of the ideal coaxial cable;
    setting at least one attenuation range for the plurality of ideal attenuations;
    measuring at least one first test attenuation of the subject coaxial cable at a first test signal frequency of about 55 Megahertz;
    measuring at least one second test attenuation of the subject coaxial cable at a second test signal frequency of about 750 megahertz;
    comparing the at least one first test attenuation and the at least one second test attenuation with the at least one attenuation range for the plurality of ideal attenuations;
    determining whether the at least one first test attenuation and the at least one second test attenuation fall within the at least one attenuation range; and
    performing a troubleshooting function on the subject impedance member if the at least one first test attenuation or the at least one second test attenuation fall outside the at least one attenuation range.

17. The method of claim 16 wherein the at least one acceptable attenuation range comprises a tolerance for acceptable attenuation for the subject impedance member.

18. The method of claim 16 wherein the at least one acceptable attenuation range comprises a narrow attenuation range and a wide attenuation range.

19. The method of claim 18 wherein the narrow attenuation range ranges from about 1.5 dB to about 1.9 dB at 55 Megahertz of the first test signal frequency and from about 5.6 dB to about 7.1 dB at 750 Megahertz of the second test signal frequency at from about 100 to about 127 feet, respectively, of the impedance dimensions of the ideal coaxial cable at about 68 degrees F.

20. The method of claim 16 wherein measuring the at least one first test attenuation of the subject coaxial cable at the first test signal frequency comprises transmitting a test signal from an input signal source through the coaxial cable to an output signal destination, and wherein measuring at least one second test attenuation of the subject coaxial cable at the second test signal frequency comprises transmitting a test signal from the input signal source through the coaxial cable to the output signal destination.

* * * * *